United States Patent [19]

Sanderson

[11] 4,072,356

[45] Feb. 7, 1978

[54] ELECTRON BEAM WELDING GENERATORS

[75] Inventor: Allan Sanderson, Balsham, England

[73] Assignee: The Welding Institute, Cambridge, England

[21] Appl. No.: 544,010

[22] Filed: Jan. 24, 1975

[51] Int. Cl.² .................... B23K 15/00; H01J 37/315; H01J 3/26
[52] U.S. Cl. .................... 219/121 EB; 250/396 ML; 250/492 B
[58] Field of Search ................ 219/121 EB, 121 EM; 250/492, 396, 397, 398; 13/31

[56] References Cited

U.S. PATENT DOCUMENTS

| 2,802,111 | 8/1957 | Reisner | 250/396 |
| 2,987,610 | 6/1961 | Steigerwald | 219/121 EM X |
| 2,989,614 | 6/1961 | Steigerwald | 219/121 EM X |
| 3,134,013 | 5/1964 | Opitz et al. | 219/121 EM |
| 3,151,231 | 9/1964 | Steigerwald | 219/121 EM |
| 3,187,216 | 6/1965 | Sciaky | 219/121 EB X |
| 3,491,236 | 1/1970 | Newberry | 219/121 EM X |

FOREIGN PATENT DOCUMENTS

| 69,412 | 10/1969 | Germany | 219/121 EB |

OTHER PUBLICATIONS

"Debris Deflector and Collector" by Koste & Roberts, IBM Technical Disclosure, vol. 17, No. 3, Aug. 1974, pp. 860–861.

Primary Examiner—A. Bartis
Attorney, Agent, or Firm—Cushman, Darby & Cushman

[57] ABSTRACT

An electron beam generator for use in electron beam welding wherein the electron beam passes through at least two electromagnetic beam deflecting systems upstream of the electron lens and which act one after another on the beam to define a fixed nonlinear path for the electron beam from the electron gun towards the welding point on a predetermined welding axis, with the other paths being blocked. The fixed path is such that the portion of the beam leaving the last deflecting system is parallel to the portion of the beam from the gun to the first deflection system, and at least one of the beam deflecting systems is offset with respect to the welding axis. In some arrangements the first and last beam portions are in alignment. The coils of the beam deflecting systems are connected in a circuit for controlling the ratio of currents passing through the coils so that the system as a whole is self-compensating for changes in voltage or beam current.

9 Claims, 8 Drawing Figures

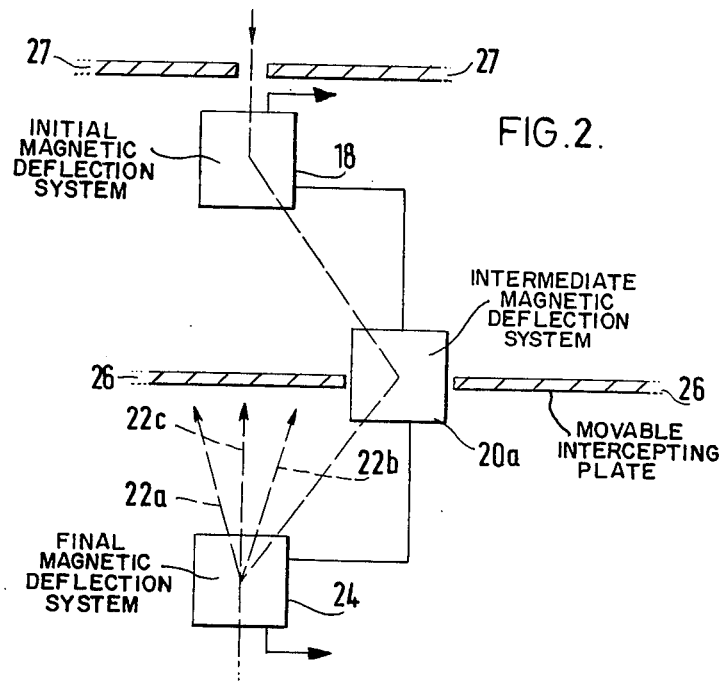
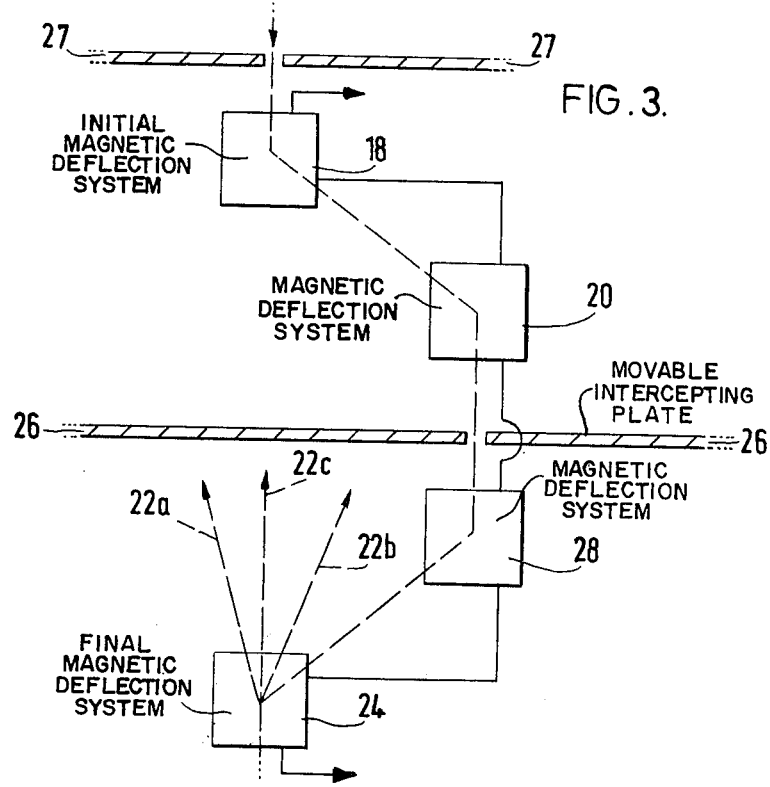

ELECTRON BEAM WELDING GENERATORS

In electron beam welding, a stream of electrons is produced and accelerated by an electron gun and is then focussed on to a workpiece to be welded. The process is extremely advantageous when deep penetration of the workpiece is required with a narrow heat-affected zone but it requires the generation of very high voltages and the process must generally be carried out in a vacuum.

Where the beam strikes the workpiece, the kinetic energy released causes intense localised heating and as a consequence vapour, gases and particles are ejected from the weld pool. This creates a problem because some of the ejected substances are directed back along the beam path to the electron gun, which can then cause high voltage breakdown between the gun electrodes and erosion of the cathode surface. In addition vapour and gases may originate from the workpiece chamber, particularly when operated at poor vacuum and these create the same problem as the ejected substances.

One solution which has been adopted to overcome this problem is to bend the beam path by making the beam pass through a magnetic deflecting field at some point in the path. Then any substance which travels back up the beam path when it reaches the magnetic deflecting field is not deflected along the electron beam path. This solution of the difficulty is satisfactory if the speed (that is, effective acceleration voltage) of the electrons is stable and if the magnetic field is stable, but a small variation in either of these factors will cause the electron beam to be deflected by the magnetic field to a greater or lesser extend than is intended, and this is a considerable disadvantage in electron beam welding where normally a very narrow and precisely positioned region of heating is required.

An alternative solution is to place a magnet to one side of the electron beam path. This acts in a manner similar to the "ion trap" of a conventional cathode ray tube, in that it deflects the heavy ions away from the beam path, but this system also is not entirely satisfactory, especially with fast moving or uncharged particles.

An electron beam generator according to the present invention includes a housing, an electron gun and means for directing an electron beam from the gun towards a predetermined welding point on a predetermined welding axis, the beam-directing means comprising two or more beam-deflecting systems, a first beam-deflecting system being fixed in the housing in the direct path of the beam from the gun and each other beam-deflecting system being fixed in the housing in the path of the beam as deflected by the preceding beam-deflecting system, the final beam-deflecting system being mounted on the predetermined welding axis, the beam-deflecting systems being such that the electron beam path from the final beam-deflecting system to the welding point is substantially parallel to the electron beam path from the electron gun to the first beam-deflecting system. In some arrangements, the two paths are in alignment. In the preferred form of apparatus embodying the invention, there are two similar but oppositely acting beam-deflecting coils, electrically connected in series, the first of which deflects the beam away from its initial direction and the second of which causes a similar but opposite beam deflection, so that the beam then travels in a path parallel to that which it would have followed in the absence of the deflections. With such an arrangement, if the electron velocity is increased the angle made by the deflected beam with its original path as a consequence of the first deflection system is smaller but so is the restoring deflection brought about by the second deflection system and consequently the final and initial paths remain substantially parallel. Ionised gases and other substances from the workpiece travelling back along the beam path are not subject to the same reverse deflections and are therefore removed from the beam path emanating from the electron gun.

Such an arrangement compensates for voltage fluctuations and ripple and for drifts in field strength or changes due to variations of temperature, so long as both fields are affected together.

In order that the invention may be better understood, some examples of apparatus embodying the invention will now be described with reference to the accompanying drawings, in which:

FIGS. 1, 2 and 3 illustrate beam-deflection systems employing two, three and four axially separated coils, respectively;

Figure 1:
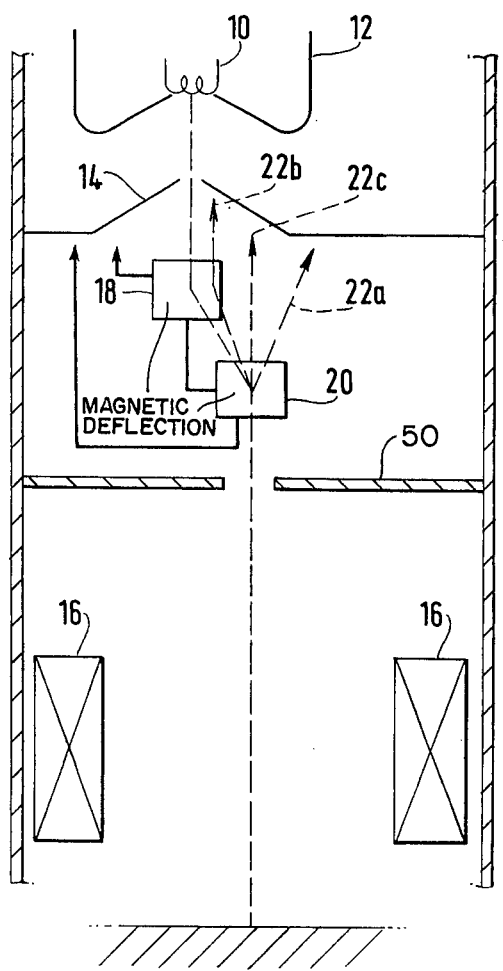

In FIG. 1, an electron beam generator has a filament 10, a control electrode 12, an anode 14 and a focusing coil 16. A first magnetic deflection system 18 is placed immediately below the anode and a second and oppositely acting magnetic deflection system 20 is placed in the path of the deflected beam. The deflection systems 18 and 20 are identical and are electrically connected in series to a D.C. supply so that the same current passes through both. They are equally subjected to any fluctuations in mains voltage or changes in temperature. Negatively charged vapour from the work is deflected by the system 20 along the dotted line path 22a indicated in the drawing. Similarly positively charged and neutral vapour would follow paths 22b and 22c respectively.

As shown in FIGS. 2 and 3, tubes employing three and four magnetic deflection systems are possible, for example where it is desired that the final beam path is aligned with the original beam path. In FIG. 2, the initial and final deflection systems 18 and 24 produce deflections in the same sense but the intermediate deflection system 20a produces a deflection which is opposite in sense and equal to the sum of the deflections produced by the systems 18 and 24. Again, the dotted line 22a, 22b, and 22c represent the path of returning negatively and positively charged vapour and neutral substances respectively. If desired, plates 26 and 27 may be interposed to prevent the passage of any vapour along the direct line. Provision may be made for removing plate 26 so that for initial axial alignment of column components, the deflection systems may remain unenergised, leaving a direct path for the beam. In the arrangement of FIG. 2, the coil 20a may carry twice the current of the coils 18 and 24 or may have twice as many turns as the coils 18 and 24; in the latter case, the three coils may be connected in series, as shown in FIG. 2.

In FIG. 3, the deflection system 20a of FIG. 2 is replaced by two deflection systems 20 and 28, both acting in the same sense, which is opposite to the sense of the initial and final deflection systems 18 and 24. The magnitudes of the deflections produced by the four systems are now equal and the systems can therefore be identical. The coils 18, 20, 28 and 24 may be electrically connected in series so that they pass the same current.

In FIG. 1, the magnetic deflection systems 18 and 20 are shown immediately below the anode and above the focusing coils. This is generally desirable for high power beams. However, in some cases, particularly for fine beams, it would be possible to place the two magnetic deflection systems 18 and 20 below the focusing coils. Additionally, in existing equipment it is generally easier to add the double-deflection system below the lens, i.e., below the focusing coils.

Figure 4:
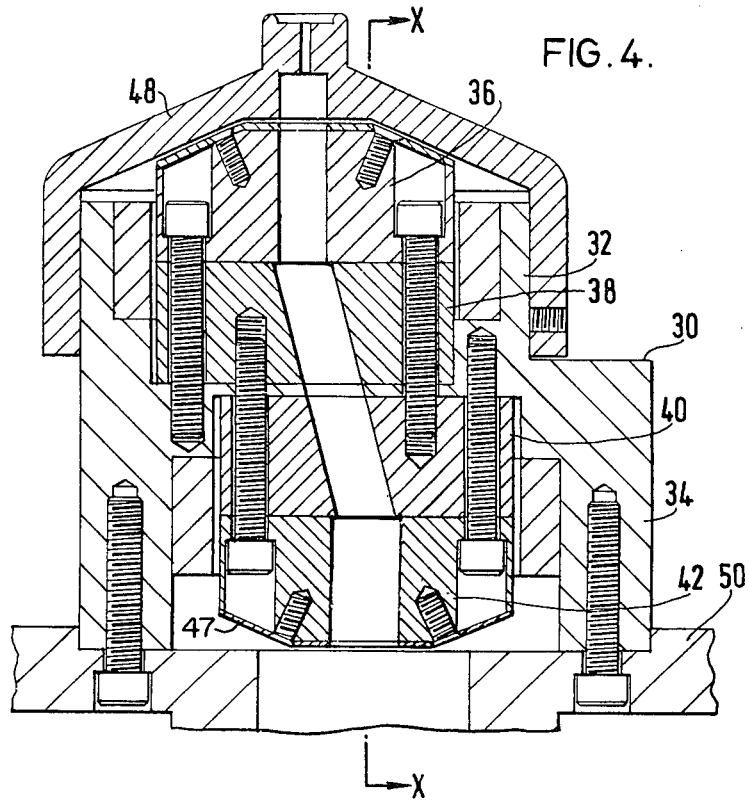
FIG. 4 is a longitudinal section through a composite beam-deflection system of an electron beam generator.
Figure 5:
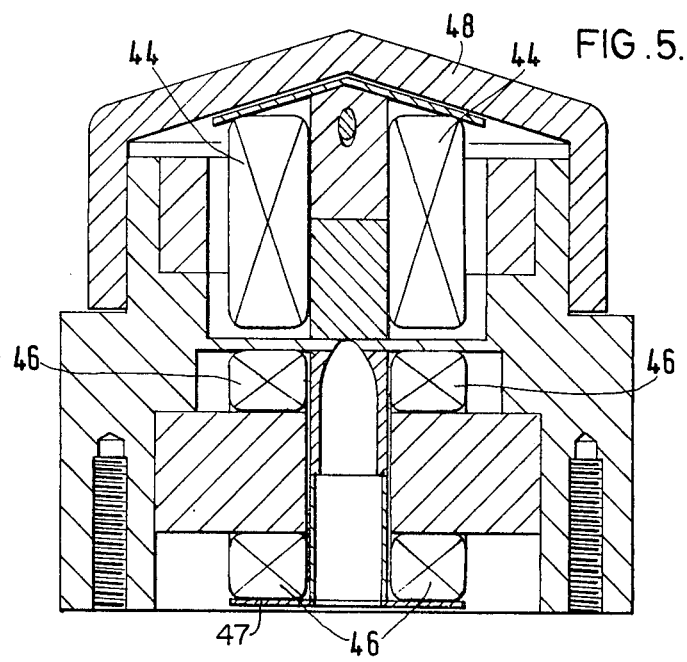
FIG. 5 is a section on line 5—5 of FIG. 4.
Figure 6:
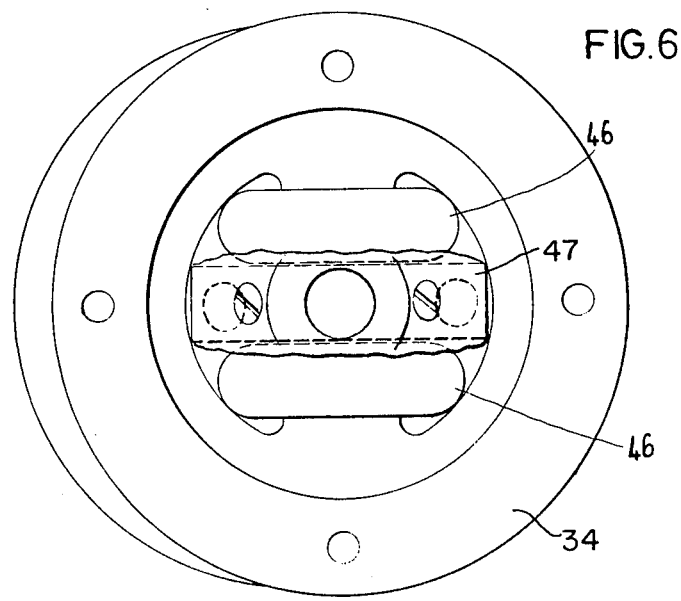
FIG. 6 is a bottom plan view of the arrangement shown in FIG. 4, with some components removed or broken away.

FIGS. 4, 5, and 6 illustrate a suitable beam deflection apparatus. In FIG. 4, a coil housing 30 of copper comprises a generally cylindrical upper portion 32 and a generally cylindrical lower portion 34, the upper portion being of smaller diameter than the lower portion and being axially offset with respect to the lower portion. Within the coil housing 30 are drift tubes 36, 38, 40 and 42 which together define a non-linear passage through the housing. The drift tubes extend diametrically across the space within the housing and have a width which is not much greater than the diameter of the tube. On each side of the drift tubes 36 and 38 are coils 44 and further coils 46 are located on each side of the drift tubes 40 and 42. The drift tubes are of copper. An anode cap 48 of copper is placed over the upper portion 32 of the coil housing 30. A metal plate 47 extends below the coils 46 and a plate 50 on which the housing 30 is mounted extends across the column of the electron beam generator, thereby sealing the upper portion from the lower portion. In the bottom plan view of FIG. 6, the plate 50 is removed and the plate 47 is partially broken away.

As previously explained, the currents which pass through the deflection coils are such that the beam receives equal and opposite deflections in the upper and lower halves of the apparatus shown in the drawings, so that the beam which leaves the apparatus is parallel but offset with respect to the beam which enters the apparatus from the electron gun.

The diameter of the drift tube path preferably increases from top to bottom of the beam deflection system. The increase may be a gradual taper but it is more convenient for manufacturing purposes if the passage is stepped to produce the same effect. As is well known, a tube with a progressively increasing diameter between two vacuum chambers facilitates the maintenance of a higher vacuum in the chamber which receives the smaller-diameter end of the tube than is present in the chamber which receives the large-diameter end of the tube.

Figure 8:
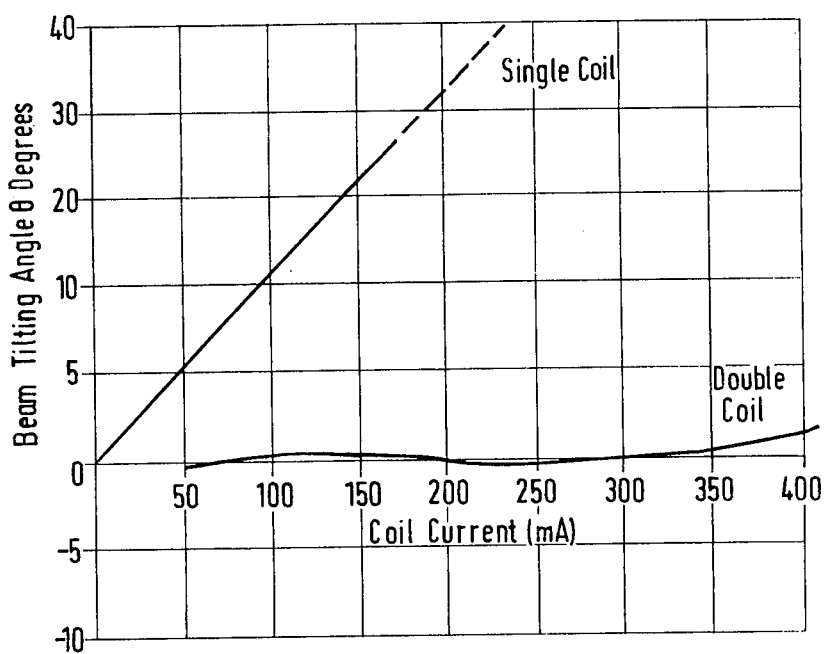
FIG. 8 is a graph showing the effect of the double deflection system on beam deflection when the coil current is changed.
Figure 7:
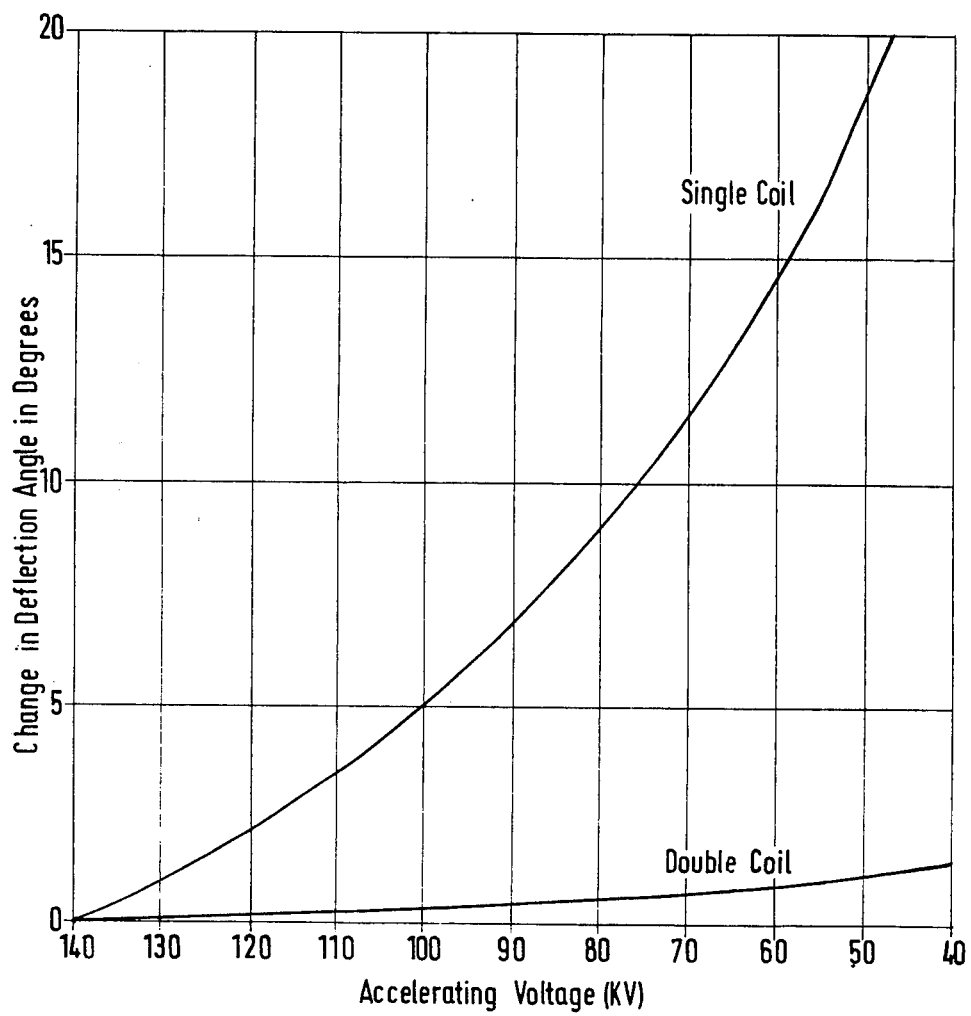
FIG. 7 is a graph showing the effect of a double deflection system on deflection angle when the accelerating voltage is changed.

FIG. 7 illustrates the change in deflection angle which is produced by a change of accelerating voltage, for a single coil deflection system and for a double coil deflection system of the type shown in FIG. 1. The total coil current for FIG. 7 was 215 milliamps. In the arrangement employing a single coil, a change in accelerating voltage from 140 kV to 50 kV caused a progressive change in deflection angle which reached 19°. A change from 140 kV to 120 kV resulted in a deflection of 2.3°. Using a double deflection of the kind described above, a change in accelerating voltage from 140 kV to 120 kV resulted in only 0.2° change of deflection angle and a variation of accelerating voltage from 140 kV to 50 kV caused a change in deflection angle of only just over 1°. The effect of change of coil current on total beam deflection angle is also greatly reduced, as shown by FIG. 8. With a single coil an increase in coil current from zero to 250 milliamps caused a beam tilting (i.e., deflection) angle of about 45°. Using the double beam deflection system, during an increase from 50 milliamps to 325 milliamps, the beam tilting angle was never greater than 0.4° and at 400 milliamps it had reached only 1.6°.

I claim:

1. An electron beam generator comprising:

a housing;

an electron gun mounted within said housing;

an electron lens mounted within said housing; and means within said housing defining a fixed path for the electron beam from the gun towards a predetermined welding point on a predetermined welding axis and blocking other paths, the path defining means including a beam-directing means upstream of the electron lens comprising at least two electromagnetic beam-deflecting systems, including respective coils, a first of the beam deflecting systems being fixed in the housing in the direct path of the beam from the gun, and each other beam-deflecting system being fixed in the housing in the path of the beam as deflected by the preceding beam-deflecting system, the final beam deflecting system being mounted on the predetermined welding axis, whereby the axis of at least one of the beam-deflecting systems is off-set with respect to the said welding axis and the said path defined by the beam-directing means is non-linear; circuit means in which said coils of the beam-deflecting systems are connected for controlling the ratio of current passing through the coils, whereby the electron beam path from the final beam-deflecting system to the welding point is substantially parallel to the first electron beam path from the electron gun to the first beam deflecting system, and metal block means formed with a non-linear bore defining that part of the said fixed path for the electron beam which extends from the first beam deflecting system to the final beam deflecting system, the respective coils of the electromagnetic beam-deflecting /systems being mounted alongside the metal block means adjacent successive sections of the said bore.

2. An electron beam generator in accordance with claim 1, in which the coils are connected in series.

3. An electron beam generator in accordance with claim 1, including intercepting means positioned between the electron gun and the electromagnetic beam deflecting system positioned furthest from the electron gun and extending transversely of the said welding axis, the said intercepting means having an aperture to permit the passage of the electron beam along the said fixed path but serving to intercept particles returning from the welding point which are deflected by one of the said beam deflecting systems along paths other than the said fixed path.

4. An electron beam generator in accordance with claim 3, in which the said intercepting means is a diaphragm extending across the electron beam generator.

5. An electron beam generator in accordance with claim 1, in which the bore is of progressively increasing diameter from the end nearer to the electron gun to the end remote from the electron gun, and in which a diaphragm extends across the electron beam generator column so as to separate the part of the electron beam generator in communication with the smaller diameter end of the bore from that part of the electron beam generator in communication with the larger diameter end of the bore.

6. An electron beam generator in accordance with claim 1, in which the beam deflecting systems define an electron beam path such that the portion of the path from the final beam-deflecting system to the welding point is in alignment with the portion of the path from the electron gun to the first beam-deflecting system.

7. An electron beam generator in accordance with claim 1, further including intercepting means positioned between the first and final beam-deflecting systems in the direction of the length of the electron beam generator and extending transversely of the electron beam generator.

8. An electron beam generator comprising:
a housing;
an electron gun mounted within said housing;
an electron lens mounted within said housing; and
means within said housing defining a fixed path for the electron beam from the gun towards a predetermined welding point on a predetermined welding axis and blocking other paths, the path-defining means including a beam-directing means upstream of the electron lens comprising at least three electromagnetic beam-deflecting systems, including respective coils, a first of the beam deflecting systems being fixed in the housing in the direct path of the beam from the gun, and each other beam-deflecting system being fixed in the housing in the path of the beam as deflected by the preceding beam-deflecting system, the final beam deflecting system being mounted on the predetermined welding axis and the electron beam path from the final beam deflecting system to the welding point being in alignment with the electron beam path from the electron gun to the first beam deflecting system, whereby at least one of the beam-deflecting systems is off-set with respect to the said welding axis and the said path defined by the beam-directing means is non-linear; circuit means in which said coils of the beam-deflecting systems are connected for controlling the ratio of current passing through the coils; the generator further including intercepting means positioned between the final and first beam deflecting systems and extending across the electron beam generator to block paths between the workpiece and cathode other than the said fixed path, the intercepting means being movable to open the path from the workpiece to the electron gun for beam prealignment.

9. An electron beam generator as defined in claim 8, in which the said coils are connected in series.

* * * * *